United States Patent [19]

Lawton

[11] Patent Number: 5,451,899
[45] Date of Patent: Sep. 19, 1995

[54] DIRECT CONVERSION FSK RECEIVER USING FREQUENCY TRACKING FILTERS

[75] Inventor: Rodney J. Lawton, Wiltshire, United Kingdom

[73] Assignee: Plessey Semiconductors Limited, United Kingdom

[21] Appl. No.: 302,510

[22] Filed: Sep. 8, 1994

[30] Foreign Application Priority Data

Sep. 14, 1993 [GB] United Kingdom ............... 9318981

[51] Int. Cl.6 ................... H04L 27/148; H04L 27/152
[52] U.S. Cl. ........................................ 329/302; 375/80; 375/102; 375/103; 375/120; 375/324; 375/349; 375/350; 375/376
[58] Field of Search ............... 329/300, 301, 302, 303; 375/80, 82, 88, 102, 103, 120

[56] References Cited

U.S. PATENT DOCUMENTS

| 3,611,195 | 10/1971 | Parham .................. 331/115 |
| 4,953,010 | 8/1990 | Cowley ................. 455/216 |
| 5,040,192 | 8/1991 | Tjahjadi ................. 375/80 |
| 5,309,480 | 5/1994 | Powell, II et al. ....... 329/302 |
| 5,361,408 | 11/1994 | Watanabe et al. ....... 455/324 |

FOREIGN PATENT DOCUMENTS

| 0125722 | 11/1984 | European Pat. Off. . |
| 0153835 | 9/1985 | European Pat. Off. . |
| 0200271 | 11/1986 | European Pat. Off. . |
| 2151093 | 7/1985 | United Kingdom . |

Primary Examiner—Siegfried Grimm
Attorney, Agent, or Firm—Kirschstein, et al.

[57] ABSTRACT

In a direct conversion receiver in which received radio frequency signals are mixed with quadrature local oscillator signals in I and Q channels, the output signals from the mixers are applied to a phase detector by way of respective frequency tracking filters to reduce the noise bandwidth and improve the sensitivity.

10 Claims, 1 Drawing Sheet

DIRECT CONVERSION FSK RECEIVER USING FREQUENCY TRACKING FILTERS

BACKGROUND OF THE INVENTION

The present invention relates to direct conversion, or homodyne, receivers. Such receivers are commonly used in radio pagers.

SUMMARY OF THE INVENTION

According to one aspect of the present invention in a direct conversion frequency shift keying radio receiver arrangement in which received radio frequency signals are mixed with local oscillator signals in quadrature-phase arms and the output signals from said quadrature-phase arms are applied to a phase detector to recover data signals represented by said frequency shift keying, each of said quadrature-phase arms includes a frequency tracking filter.

According to another aspect of the present invention in a direct conversion radio receiver arrangement, received radio frequency signals are applied to two mixer circuits to which local oscillator signals are applied in phase quadrature, output signals from said mixer circuits being applied to a phase detector of the receiver arrangement by way of respective frequency tracking filter circuits.

The frequency tracking filters may comprise, for example, injection locked oscillators, phase locked loops or phase locked filter loops.

BRIEF DESCRIPTION OF THE DRAWINGS

A direct conversion receiver in accordance with the present invention will now be described with reference to the accompanying drawing, of which.

DETAILED DESCRIPTION OF THE PREFERRED EMBODIMENT

Figure 1:
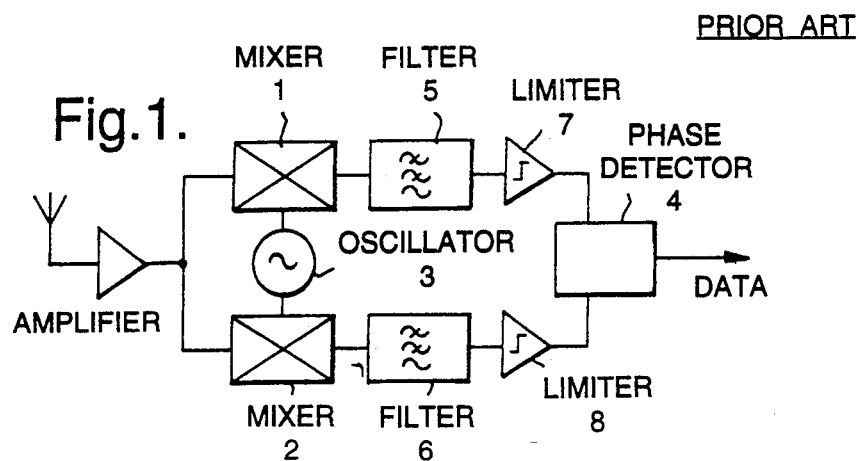
FIG. 1 shows schematically a known form of receiver.

Referring first to FIG. 1, in the known form of direct conversion receiver, received FSK radio frequency signals are applied to mixers 1 and 2 respectively in I and Q channels or arms, to which mixer signals from a local oscillator 3 are applied in phase quadrature. Output signals from the mixers 1 and 2 are applied to a phase detector 4 by way of respective low pass mixers 5 and 6 and limiters 7 and 8.

Figure 2:
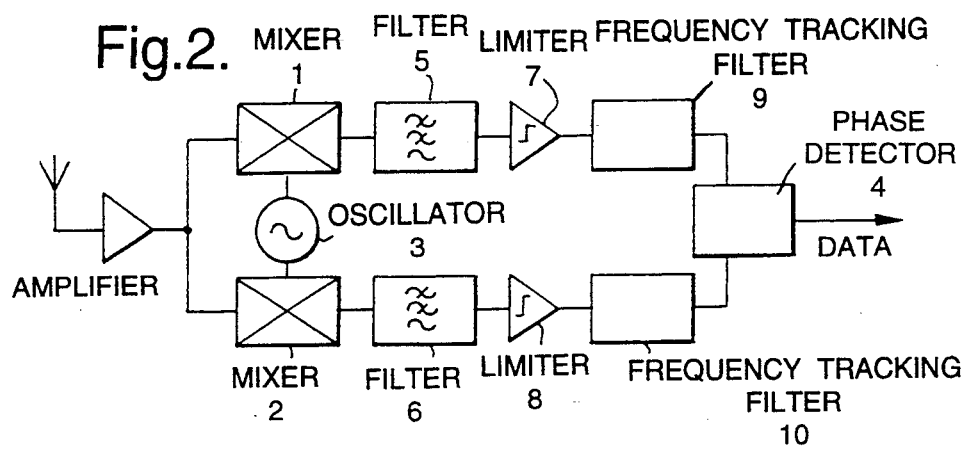
FIG. 2 shows schematically a receiver in accordance with the invention.

Referring to FIG. 2, in accordance with the present invention, the output signals from the limiters 7 and 8 are applied to the phase detector 4 by way of respective frequency tracking filters 9 and 10, which may take the form of injection locked oscillators, phase locked loops or phase locked filter loops. These frequency tracking filters are arranged to track the difference frequencies generated in the I and Q arms, effectively reducing the noise bandwidth to that required to pass the difference frequency. This improves the signal to noise ratio ahead of the detector 4 and hence improves the sensitivity, by a factor approximating to the square root of the modulation index.

Figure 3:
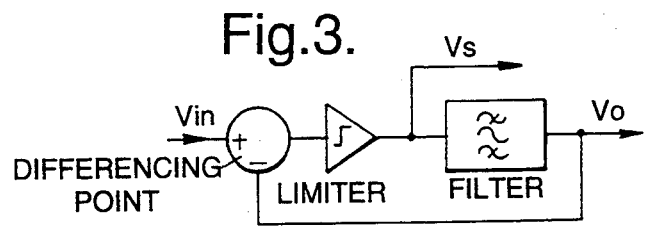
FIG. 3 shows a part of the receiver of FIG. 2 in more detail.

Referring now to FIG. 3, injection locked oscillators may be preferred as the frequency tracking filters, in view of their simple structure, not requiring any tuning components such as variable capacitance diodes.

Figure 4:
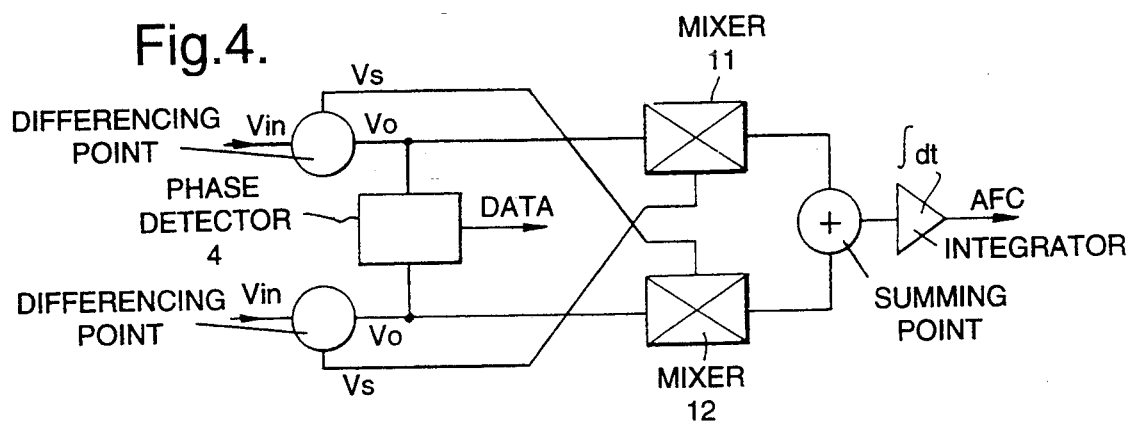
FIG. 4 shows schematically a variation of pan of the receiver shown in FIG. 2.

As shown in FIG. 4, the inherent phase shifts experienced in the injection locked oscillators may be used to provide an automatic frequency control signal for the local oscillator 3, by mixing signals Vs obtained from the point shown in FIG. 3 with the output signals Vo from the opposite arm in mixers 11 and 12, and integrating the resultant signals to provide an AFC signal. Where simplicity is required one or other of the mixers 11 or 12 may be omitted.

I claim:

1. A direct conversion frequency shift keying radio receiver arrangement in which received radio frequency signals are mixed with local oscillator signals in quadrature-phase arms and the output signals from these quadrature-phase arms are applied to a phase detector to recover data signals represented by said frequency shift keying, wherein each of said quadrature-phase arms includes a frequency tracking filter.

2. A direct conversion radio receiver arrangement in which received radio frequency signals are applied to two mixer circuits to which local oscillator signals are applied in phase quadrature, wherein output signals from said mixer circuits are applied to a phase detector of the receiver arrangement by way of respective frequency tracking filter circuits.

3. A direct conversion radio receiver arrangement in accordance with claim 1 wherein the frequency tracking filters comprise injection locked oscillators.

4. A direct conversion radio receiver arrangement in accordance with claim 1 wherein the frequency tracking filters comprise phase locked loop circuits.

5. A direct conversion radio receiver arrangement in accordance with claim 1 wherein the frequency tracking filters comprise phase locked filter loops.

6. A direct conversion radio receiver arrangement in accordance with claim 3 wherein signals derived from said injection locked oscillators are utilized to derive a signal for controlling the frequency of said local oscillator signals.

7. A direct conversion radio receiver arrangement in accordance with claim 2 wherein the frequency tracking filters comprise injection locked oscillators.

8. A direct conversion radio receiver arrangement in accordance with claim 2 wherein the frequency tracking filters comprise phase locked loop circuits.

9. A direct conversion radio receiver arrangement in accordance with claim 2 wherein the frequency tracking filters comprise phase locked filter loops.

10. A direct conversion radio receiver arrangement in accordance with claim 7 wherein signals derived from said injection locked oscillators are utilized to derive a signal for controlling the frequency of said local oscillator signals.

* * * * *